United States Patent
Ohishi

(10) Patent No.: US 9,740,068 B2
(45) Date of Patent: Aug. 22, 2017

(54) ACTIVE MATRIX CIRCUIT, METHOD OF MANUFACTURING ACTIVE MATRIX CIRCUIT AND IMAGE DISPLAY APPARATUS

(71) Applicant: Sakai Display Products Corporation, Sakai-shi, Osaka (JP)

(72) Inventor: Takuya Ohishi, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 63 days.

(21) Appl. No.: 14/655,267

(22) PCT Filed: Apr. 2, 2014

(86) PCT No.: PCT/JP2014/059770
§ 371 (c)(1),
(2) Date: Jun. 24, 2015

(87) PCT Pub. No.: WO2014/163118
PCT Pub. Date: Oct. 9, 2014

(65) Prior Publication Data
US 2015/0316824 A1 Nov. 5, 2015

(30) Foreign Application Priority Data
Apr. 5, 2013 (JP) ................. 2013-079700

(51) Int. Cl.
*G02F 1/1362* (2006.01)
*H01L 27/12* (2006.01)
*G09G 3/36* (2006.01)

(52) U.S. Cl.
CPC .... *G02F 1/136204* (2013.01); *H01L 27/1244* (2013.01); *G09G 3/3648* (2013.01); *G09G 2300/0426* (2013.01); *G09G 2330/04* (2013.01)

(58) Field of Classification Search
CPC ............ G02F 1/136204; G02F 1/1309; G02F 2001/136254; G02F 2001/136268; G02F 1/136259; G02F 2001/13629; G09G 3/006; G09G 2330/04; G09G 2330/10; G09G 2330/08; H01L 27/1259
See application file for complete search history.

(56) References Cited

U.S. PATENT DOCUMENTS

2001/0045996 A1    11/2001    Kawai et al.

FOREIGN PATENT DOCUMENTS

| JP | 10-020336 A | 1/1998 |
| JP | 2009-175476 A | 8/2009 |
| JP | 2010-145772 A | 7/2010 |

*Primary Examiner* — Jose R Diaz
(74) *Attorney, Agent, or Firm* — Rudy J. Ng; Bret E. Field; Bozicevic, Field & Francis LLP

(57) ABSTRACT

The active matrix circuit comprises a protection circuit which protects an active element from static electricity. In the protection circuit, a TFT (switching element) is connected via a connection wire between gate wires (signal wires). The connection wire includes a cutoff part, and a mark representing the cutoff part is located. A middle point which is equally distant from two contact holes (connection points) closest to the connection wire is included in a range of the cutoff part. In a case where a defect occurs, the cutoff part of the connection wire connected to the TFT concerned with the defect is cut. The protection circuit is modified by the cutting. The cutoff part is away from the contact hole, thereby preventing an electrically conductive material which disperses from adhering to the contact hole.

18 Claims, 11 Drawing Sheets

F I G. 2
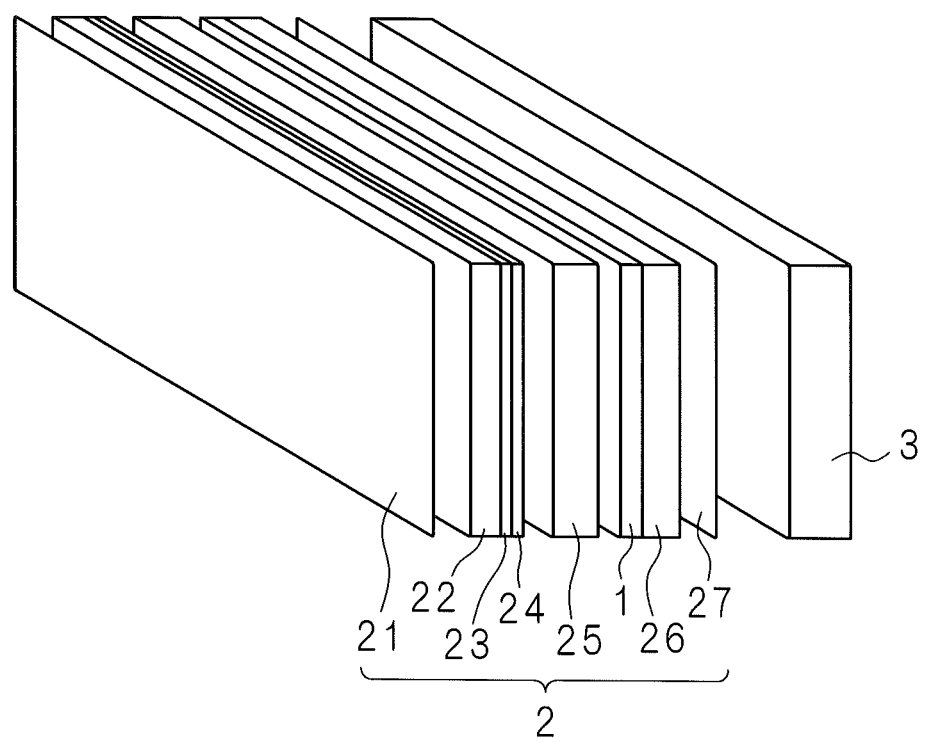

F I G. 3
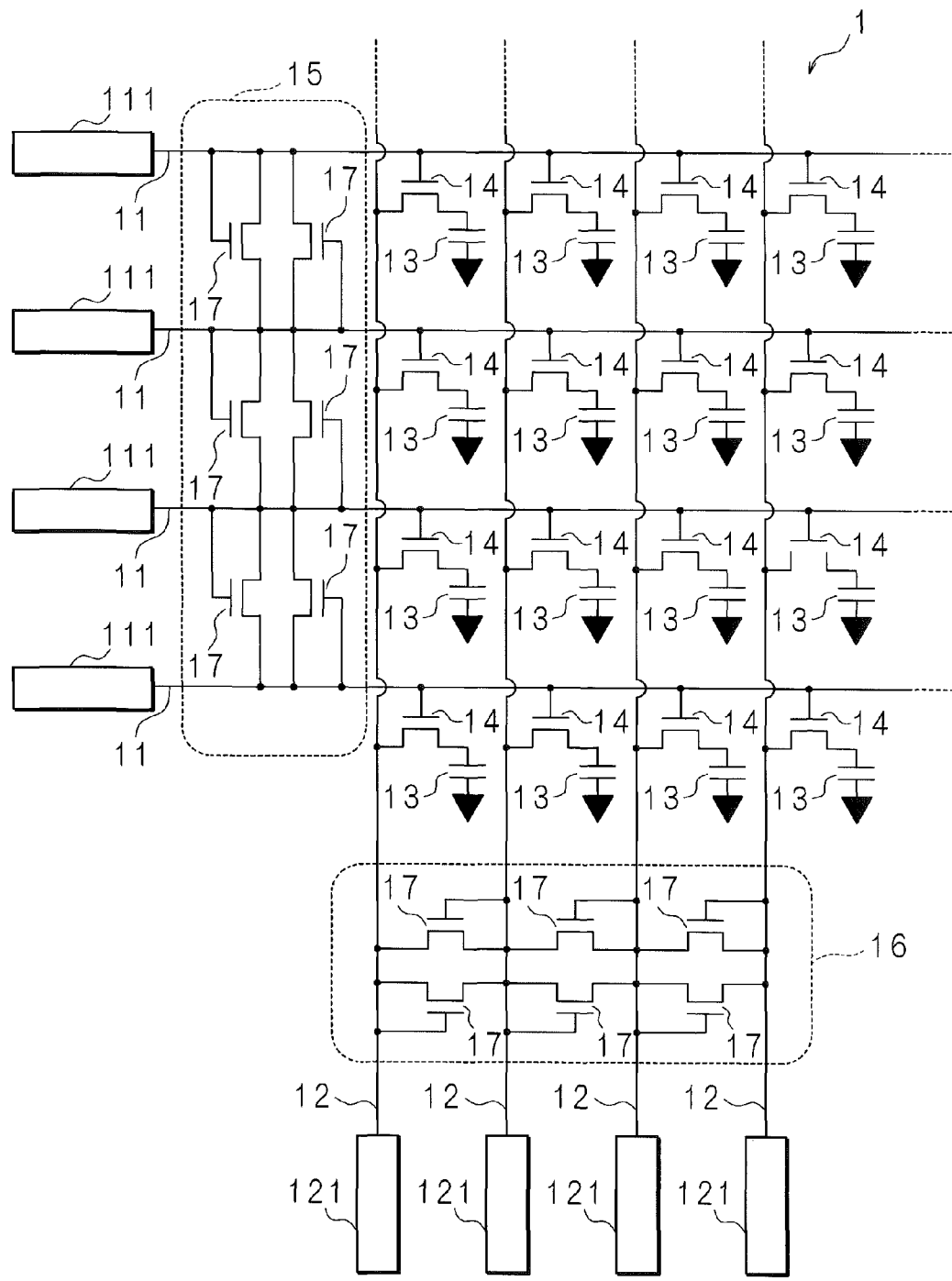

F I G. 7
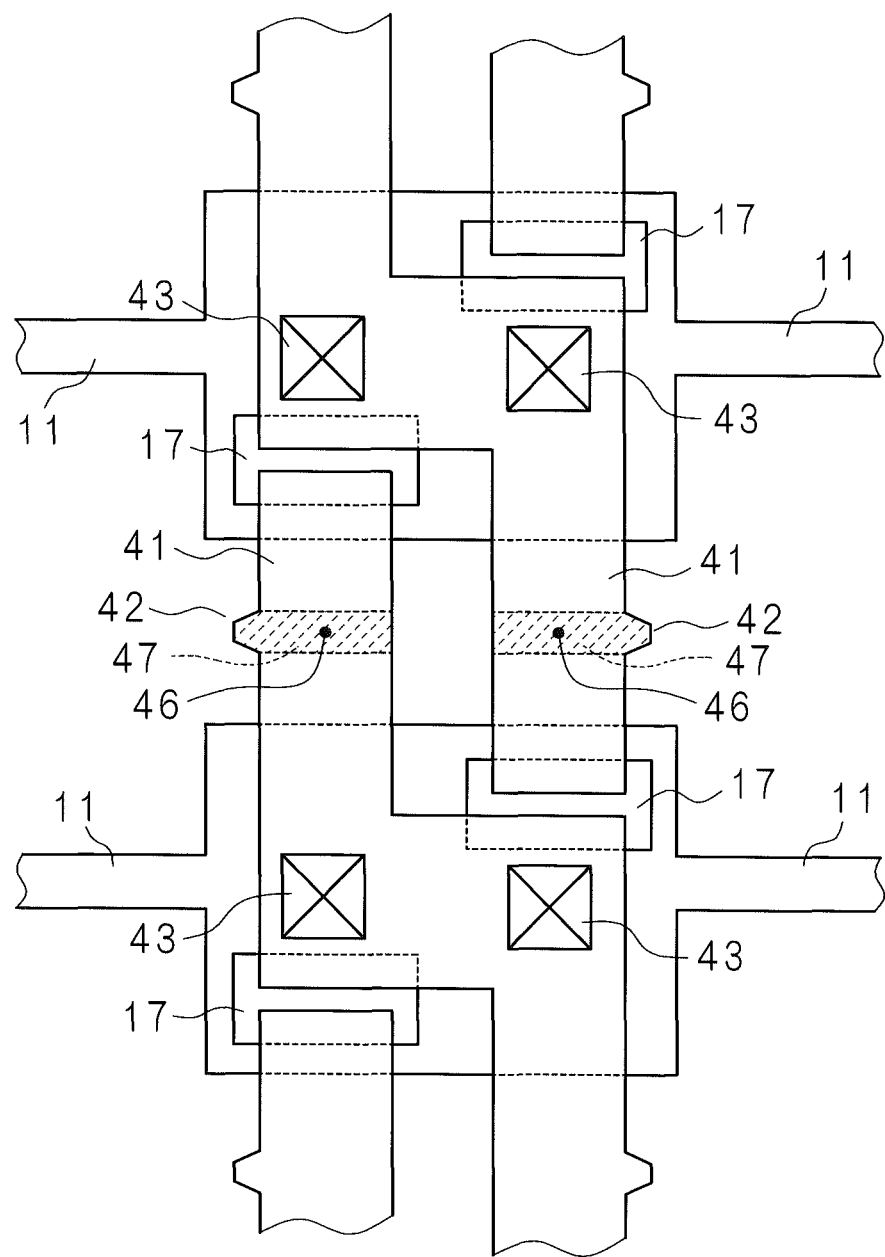

ACTIVE MATRIX CIRCUIT, METHOD OF MANUFACTURING ACTIVE MATRIX CIRCUIT AND IMAGE DISPLAY APPARATUS

This application is the national phase under 35 U.S.C. §371 of PCT International Application No. PCT/JP2014/059770 which has an International filing date of Apr. 2, 2014 and designated the United States of America.

BACKGROUND

1. Technical Field

The present invention relates to an image display apparatus of an active matrix type, and more specifically relates to an active matrix circuit, a method of manufacturing the active matrix circuit and an image display apparatus.

2. Description of Related Art

As a liquid crystal panel used in an image display apparatus, there is a liquid crystal panel comprising an active matrix circuit. In the active matrix circuit, a plurality of pixel electrodes which apply a voltage to liquid crystal corresponding to pixels are arranged in a matrix, and an active element is connected to each of the pixel electrodes. The active element is a TFT (thin film transistor), for example. In the active matrix circuit, a plurality of parallel signal wires and a plurality of other signal wires which are orthogonal to said plurality of signal wires are arranged, and the active element is connected to two signal wires which cross each other in a plan view. A current flows through the two crossing signal wires, thereby the active element is turned on and the pixel electrode applies a voltage to the liquid crystal to drive the liquid crystal panel.

The active matrix circuit often comprises a protection circuit which protects the active element from static electricity. Japanese Patent Application Laid-Open No. H10-20336 discloses an example of an active matrix circuit comprising a protection circuit. In the protection circuit disclosed in Japanese Patent Application Laid-Open No. H10-20336, two switching elements are connected between two adjacent signal wires in anti-parallel. In a case where deviation of charges arises between the two adjacent signal wires due to static electricity, the switching element of the protection circuit is turned on, and the charges are distributed to the plurality of signal wires to protect the active element which operates the pixel electrode. In a case where the deviation of charges does not arise, the switching element of the protection circuit is in an off-state, a resistance between the two adjacent signal wires is high, and no effect is exercised on a signal traveling through the signal wires.

SUMMARY OF THE INVENTION

The signal wire in the protection circuit and a connection wire connecting the switching element to the signal wire are formed of two electrically-conductive layers laminated via an insulating layer, and a contact hole which brings the two electrically-conductive layers into contact with each other is arranged in a connection portion where the signal wire is connected to the connection wire. In a manufacturing process of the active matrix circuit, a defect may occur that a resistance decreases between two signal wires connected to the switching element in the protection circuit. As the defect in the manufacturing process, there is a deficit of the insulating layer or a leak between the two electrically-conductive layers due to an electrostatic breakdown, for example.

In a case where a resistance decreases between two signal wires in the protection circuit, a current flows between the two signal wires even in a condition where deviation of charges does not arise, and an adverse effect is exercised on a signal. Then, the protection circuit is modified by cutting with a laser a connection wire connected to a portion which causes the decrease of the resistance.

However, when the connection wire in the protection circuit is cut with the laser, an electrically conductive material will disperse from a cut portion. In a case where the dispersing electrically conductive material adheres to the contact hole, other defect may occur. For example, the active matrix circuit is disposed opposite to a circuit comprising an electrode facing a pixel electrode in a liquid crystal panel, therefore, a short circuit may arise via an electrically conductive material between the circuit opposite to the active matrix circuit and the contact hole.

The present invention has been made in consideration of such a situation, and an object thereof is to provide an active matrix circuit, a method of manufacturing the active matrix circuit and an image display apparatus which prevents an electrically conductive material dispersing at the time of cutting a connection wire from adhering to a contact hole to a maximum extent, so as to prevent a defect of a protection circuit.

The active matrix circuit according to the present invention is an active matrix circuit comprising: a plurality of signal wires arranged in a lattice shape; a plurality of electrodes and a plurality of active elements which are arranged corresponding to intersections of the plurality of signal wires; and a protection circuit which protects the active elements from static electricity, wherein said protection circuit is provided with: a switching element connected between two signal wires; a connection wire which connects the switching element to the signal wire; and a connection point where the connection wire is connected to the signal wire, and the connection wire includes a cutoff part to be cut, and the cutoff part includes a position which is equally distant on the connection wire from two connection points closest to the connection wire.

The active matrix circuit according to the present invention is an active matrix circuit comprising: a plurality of signal wires arranged in a lattice shape; a plurality of electrodes and a plurality of active elements which are arranged corresponding to intersections of the plurality of signal wires; and a protection circuit which protects the active elements from static electricity, wherein the protection circuit is provided with: an electrically conductive wire; a switching element connected to the electrically conductive wire and the signal wire; a connection wire which connects the switching element to the signal wire or the electrically conductive wire; and a connection point where the connection wire is connected to the signal wire or the electrically conductive wire, and the connection wire includes a cutoff part to be cut, and the cutoff part includes a position which is equally distant on the connection wire from two connection points closest to the connection wire.

In the active matrix circuit according to the present invention, the protection circuit is further provided with a mark representing the cutoff part.

In the active matrix circuit according to the present invention, the mark is a projecting part where a part of the connection wire projects in a direction which crosses the connection wire.

In the active matrix circuit according to the present invention, the mark is a narrowed part provided in a middle of the connection wire.

In the active matrix circuit according to the present invention, the mark is located apart from the connection wire, and is a pattern which points the cutoff part.

The method of manufacturing an active matrix circuit according to the present invention is a method of manufacturing an active matrix circuit according to the present invention, comprising cutting a cutoff part of a connection wire connected to a switching element whose resistance value in an Off-state is not larger than a predetermined value.

The image display apparatus according to the present invention is an image display apparatus comprising an active matrix circuit according to the present invention.

In the present invention, the active matrix circuit to be provided in an image display apparatus comprises the protection circuit which protects from static electricity the plurality of active elements driving the plurality of electrodes arranged in a matrix. In the protection circuit, the switching element is connected via the connection wire between the signal wires connected to the active element, or between the signal wire and the electrically conductive wire. The connection wire is connected to the signal wire or the electrically conductive wire at the connection point, and includes the cutoff part to be cut in a case where a defect occurs in the protection circuit. The cutoff part includes a position which is equally distant on the connection wire from two connection points closest to the connection wire. In a case where a defect of the decrease of a resistance via a switching element placed in an Off-state occurs at the time of manufacturing an active matrix circuit, the cutoff part of the connection wire connected to the switching element concerned with the defect is cut. The protection circuit is modified by the cutting. A position to be cut is away from the connection point, thereby preventing an electrically conductive material which disperses at the time of cutting from adhering to the connection point.

In the present invention, the cutoff part is represented by the mark. When the connection wire is cut, the cutoff part represented by the mark is cut.

In the present invention, the mark is the projecting part where the part of the connection wire projects.

In the present invention, the mark is the narrowed part provided in a middle of the connection wire.

In the present invention, the mark is the pattern away from the connection wire.

According to the present invention, the present invention brings an outstanding effect, so as to modify a protection circuit where a defect occurred while preventing a defect from occurring due to the fact that an electrically conductive material adheres to a connection point of a wire in the protection circuit at the time of manufacturing an active matrix circuit.

The above and further objects and features of the invention will more fully be apparent from the following detailed description with accompanying drawings.

BRIEF DESCRIPTION OF THE SEVERAL VIEWS OF THE DRAWINGS

FIG. 2 is an exploded perspective view showing a configuration of an optical element of the image display apparatus;

FIG. 3 is an equivalent circuit view of an active matrix circuit according to Embodiment 1;

FIG. 7 is a schematic view expanding a connection portion where gate wires in a protection circuit are connected to TFTs according to Embodiment 2;

DETAILED DESCRIPTION

Hereinafter, the present invention will be described in detail with reference to the drawings showing Embodiments thereof.

Embodiment 1

Figure 1:
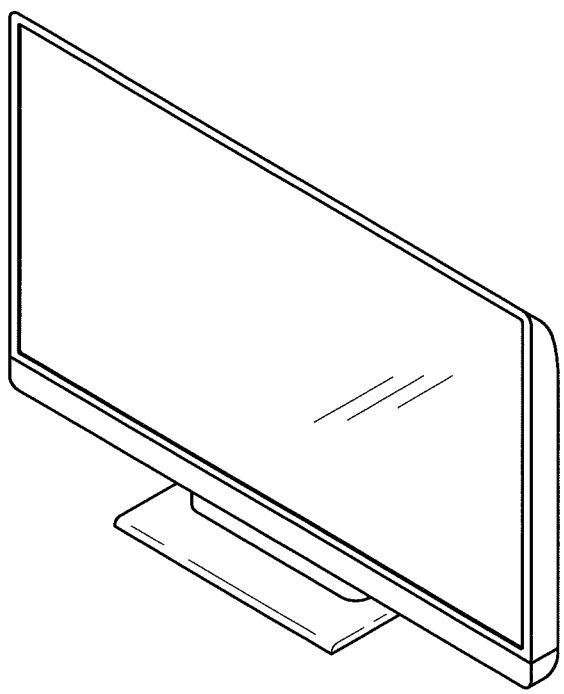
FIG. 1 is a schematic perspective view showing an external appearance of an image display apparatus of the present invention.

FIG. 1 is a schematic perspective view showing an external appearance of an image display apparatus of the present invention, and FIG. 2 is an exploded perspective view showing a configuration of an optical element of the image display apparatus. The image display apparatus is a television receiver, for example. The image display apparatus comprises a liquid crystal panel 2 and a backlight 3 arranged behind the liquid crystal panel 2. The liquid crystal panel 2 is illuminated from behind by the backlight 3 to display an image. The liquid crystal panel 2 is provided with a polarization plate 21 and a polarization plate 27 which cause linearly polarized light whose polarization directions are orthogonal to each other to penetrate. Other elements of the liquid crystal panel 2 are arranged between the polarization plate 21 and the polarization plate 27. A transparent substrate 26 is arranged on a front side of the polarization plate 27. An active matrix circuit 1 is mounted in a front face of the substrate 26. On a front side of the active matrix circuit 1, a liquid crystal section 25 is arranged, and is configured to hold a liquid crystal layer back and forth with alignment films for aligning liquid crystal molecules. An electrode layer 24, a color filter 23, and a transparent substrate for color filter 22 are arranged on a front side of the liquid crystal section 25. The color filter 23 is arranged in a rear surface of the substrate for color filter 22, and the electrode layer 24 is arranged on a rear side of the color filter 23. The electrode layer 24 and the active matrix circuit 1 face each other with the liquid crystal section 25 therebetween, and a voltage for operating the liquid crystal panel 2 to display an image is applied between the electrode layer 24 and the active matrix circuit 1. The polarization plate 21 is arranged on a front side of the substrate for color filter 22. Note that the image display apparatus may further comprise other optical elements.

FIG. 3 is an equivalent circuit view of an active matrix circuit 1 according to Embodiment 1. In the active matrix circuit 1, a plurality of signal wires are arranged in a lattice shape. That is, a plurality of gate wires (signal wires) 11 are arranged in parallel, and a plurality of data wires (signal wires) 12 which are orthogonal to the gate wires 11 are arranged. An end of each gate wire 11 is connected to a gate wire terminal 111, an end of each data wire 12 is connected to a data wire terminal 121, and the gate wires 11 and the data wires 12 are configured to receive a signal. A plurality of pixel electrodes 13 are arranged in a matrix, and each pixel electrode 13 corresponds to an intersection of the gate wire 11 and the data wire 12. A TFT 14 is connected to each pixel electrode 13. The TFT 14 is connected to the gate wire 11 and the data wire 12 which intersect at the intersection to which the pixel electrode 13 corresponds. The TFT 14 is an active element which drives the pixel electrode 13. A signal travels through any one of the gate wires 11 and any one of the data wires 12, thereby one TFT 14 connected to the gate wire 11 and the data wire 12 is turned on, the pixel electrode 13 connected to the TFT 14 operates to apply a voltage between the active matrix circuit and the electrode layer 24 which face each other.

At the time of manufacturing the active matrix circuit 1, static electricity may occur in the active matrix circuit 1. The active matrix circuit 1 is provided with a protection circuit 15 which protects the TFTs 14 connected to the gate wires 11 from static electricity, and with a protection circuit 16 which protects the TFTs 14 connected to the data wires 12 from static electricity. In the protection circuit 15, two TFTs (switching elements) 17 are connected in anti-parallel between two adjacent gate wires 11 out of the plurality of parallel gate wires 11. Two terminals containing a gate of one TFT 17 are connected to one gate wire 11, the other one terminal is connected to the other gate wire 11, two terminals containing a gate of the other TFT 17 are connected to the other gate wire 11, and the other one terminal is connected to one gate wire 11. Two TFTs 17 are connected for respective combinations of two adjacent gate wires 11. In a case where static electricity occurs in the active matrix circuit 1 and deviation of charges arises between the two gate wires 11, the TFTs 17 in the protection circuit 15 is turned on, and the charges are distributed to the plurality of gate wires 11 in sequence to protect the TFTs 14 in the active matrix circuit 1 from static electricity. In a case where deviation of charges does not arise, the TFTs 17 are in an off-state, a resistance is high, and no effect is exercised on a signal traveling through the gate wires 11. Also in the protection circuit 16, two TFTs 17 are connected between two data wires 12 in anti-parallel for respective combinations of two adjacent data wires 12. In the same manner as the protection circuit 15, in a case where deviation of charges arises between the data wires 12 due to static electricity, the TFTs 17 in the protection circuit 16 is turned on, the charges are distributed to the plurality of data wires 12 in sequence to protect the TFTs 14 in the active matrix circuit 1 from static electricity.

Figure 4:
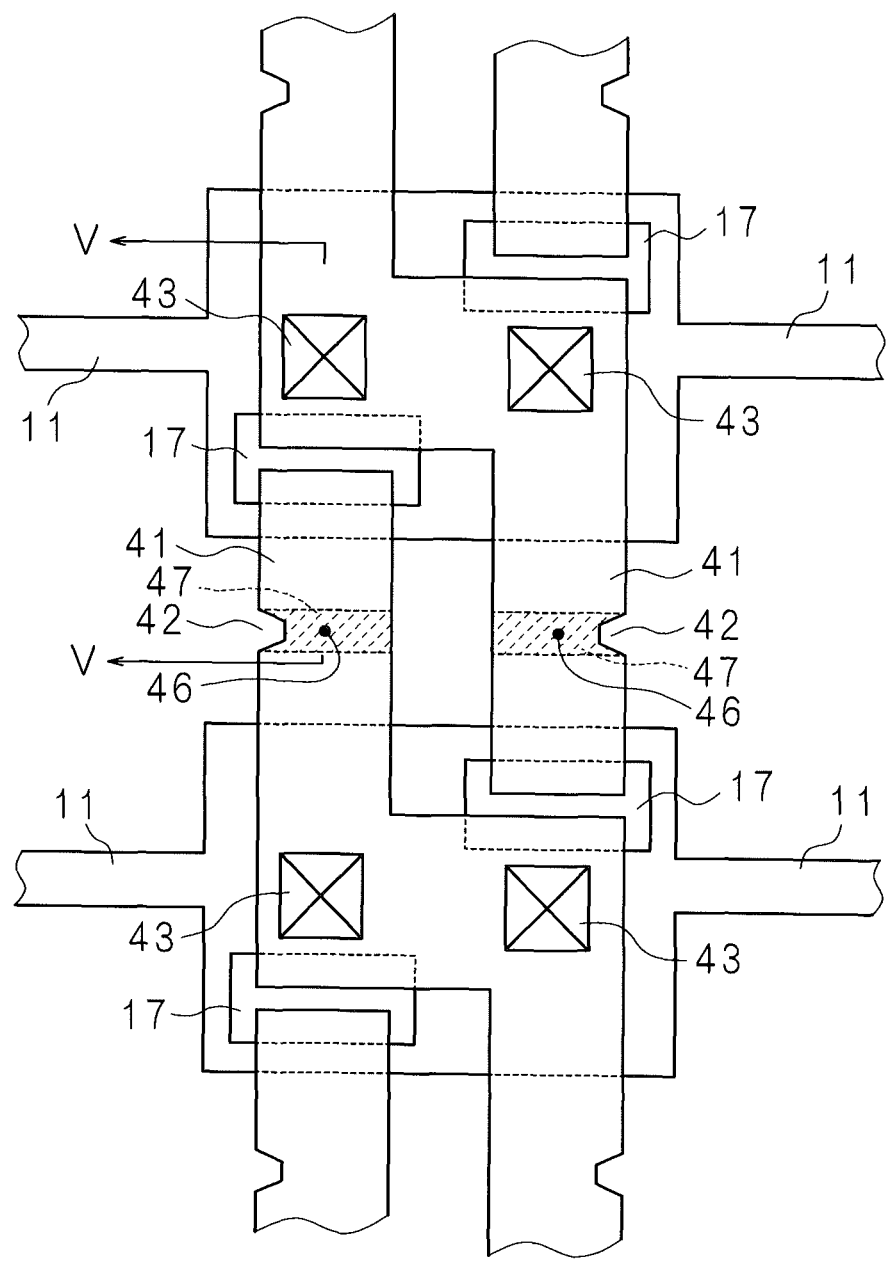
FIG. 4 is a schematic view expanding a connection portion where gate wires in a protection circuit are connected to TFTs according to Embodiment 1.
Figure 5:
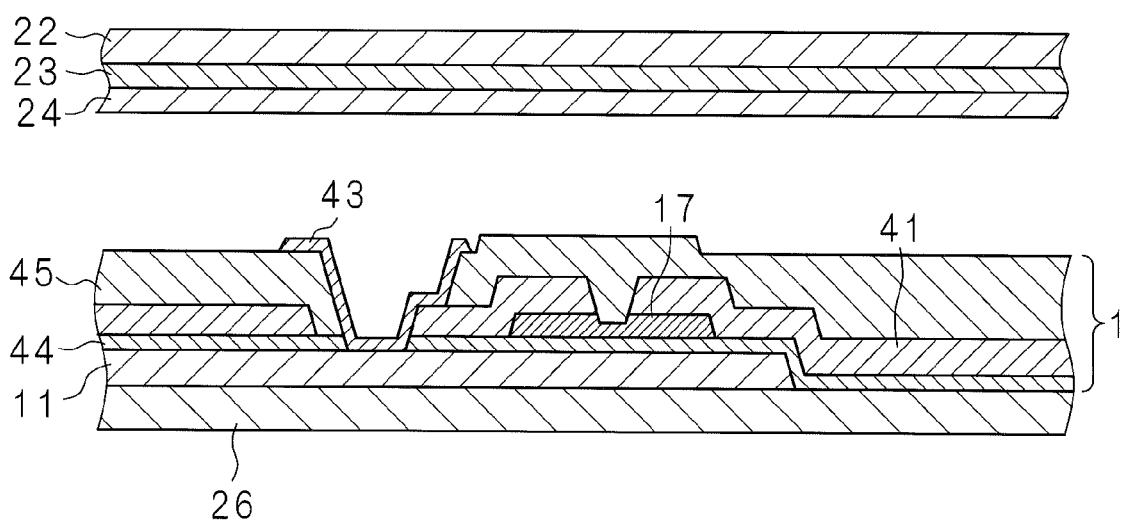
FIG. 5 is a schematic sectional view taken along a line V-V in FIG. 4.

FIG. 4 is a schematic view expanding a connection portion where the gate wires 11 in the protection circuit 15 are connected to the TFTs 17 according to Embodiment 1, and FIG. 5 is a schematic sectional view taken along a line V-V in FIG. 4. FIG. 5 also shows the electrode layer 24 facing the active matrix circuit 1, the color filter 23, and the substrate for color filter 22. The electrode layer 24 faces a portion where the protection circuit 15 exists in the active matrix circuit 1.

As shown in FIG. 5, the protection circuit 15 has a configuration where a metal layer, an insulating layer and a semiconductor layer are laminated on the substrate 26. The gate wire 11 is formed of the metal layer laminated on the substrate 26. The insulating layer 44 is laminated on the metal layer constituting the gate wire 11 and the substrate 26, the semiconductor layer is laminated on the insulating layer 44 to form the TFT 17. The metal layer is laminated on the insulating layer 44 to form a connection wire 41 connecting the TFT 17 to the gate wire 11. The connection wire 41 formed of the metal layer is connected to the TFT 17. The insulating layer 44 insulates the metal layer constituting the gate wire 11 from the metal layer constituting the connection wire 41. An insulating layer 45 is laminated on the metal layer constituting the connection wire 41. Moreover, a contact hole (connection point) 43 which connects the gate wire 11 to the connection wire 41 is arranged in the protection circuit 15. The contact hole 43 is formed of an electrically-conductive layer which contacts both of the metal layer constituting the gate wire 11 and the metal layer constituting the connection wire 41, and is exposed to a position facing the electrode layer 24.

In a manufacturing process of the active matrix circuit 1, a defect of the decrease of a resistance between the gate wires 11 via the TFT 17 may occur such as a deficit of the insulating layer 44 or a leak between the metal layer of the gate wire 11 and the metal layer of the connection wire 41 due to electrostatic breakdown. In a case where such a defect occurs in the manufacturing process, a process of cutting with a laser a connection wire 41 connected to a portion which such a defect has occurred is executed. By cutting the connection wire 41, the portion which such a defect has occurred is separated from the other portion in the protection circuit 15, and the protection circuit 15 is modified so that an adverse effect is not exercised on a signal traveling through the gate wires 11. However, in a case where the connection wire 41 is cut thoughtlessly, a metal piece disperses from a cut portion, and the metal piece which disperses may adhere to the contact hole 43. In a case where the liquid crystal panel 2 comprises an active matrix circuit 1 where a metal piece adheres to the contact hole 43, other defect may occur that the metal piece contacts an electrode layer 24 facing the contact hole 43, and then a short circuit may arise via the metal piece between the contact hole 43 and the electrode layer 24. In order to prevent a defect occurring due to a metal piece, it is necessary to cut the connection wire 41 at a position apart from the contact hole 43 to a maximum extent so that a metal piece which disperses at the time of cutting the connection wire 41 does not adhere to the contact hole 43.

As shown in FIG. 4, the connection wire 41 includes a cutoff part 47 to be cut with a laser in a case where a defect occurs in the protection circuit 15. The cutoff part 47 is a part of the connection wire 41 in a state where the cutoff part 47 is not cut. The cutoff part 47 is a linear portion which crosses the connection wire 41, and has a certain amount of width. The width of the cutoff part 47 is a size sufficient to cut conduction of the connection wire 41, and, for example, corresponds to a size of a spot of a laser for cutting the connection wire 41. A position of the cutoff part 47 is a position apart from the contact hole 43 to a maximum extent. Specifically, a middle point 46 which is equally distant on the connection wire 41 from two contact holes 43 closest to the connection wire 41 is included in a range of the width of the cutoff part 47. As shown in FIG. 4, a mark 42 representing the cutoff part 47 is located in the protection circuit 15. In an example shown in FIG. 4, the contact hole 43 is located substantially on the gate wire 11, and the middle point 46 with respect to the contact holes 43 located on two gate wires 11 is included in the range of the cutoff part 47 on the connection wire 41 located between the two gate wires 11. The mark 42 represents a position of the cutoff part 47. In order to confirm the mark 42 on the protection circuit 15, it is desirable that the insulating layer 45 is not laminated on at least a portion of the connection wire 41 where the mark 42 is formed and said at lease portion of the connection wire 41 is exposed.

Figure 6:
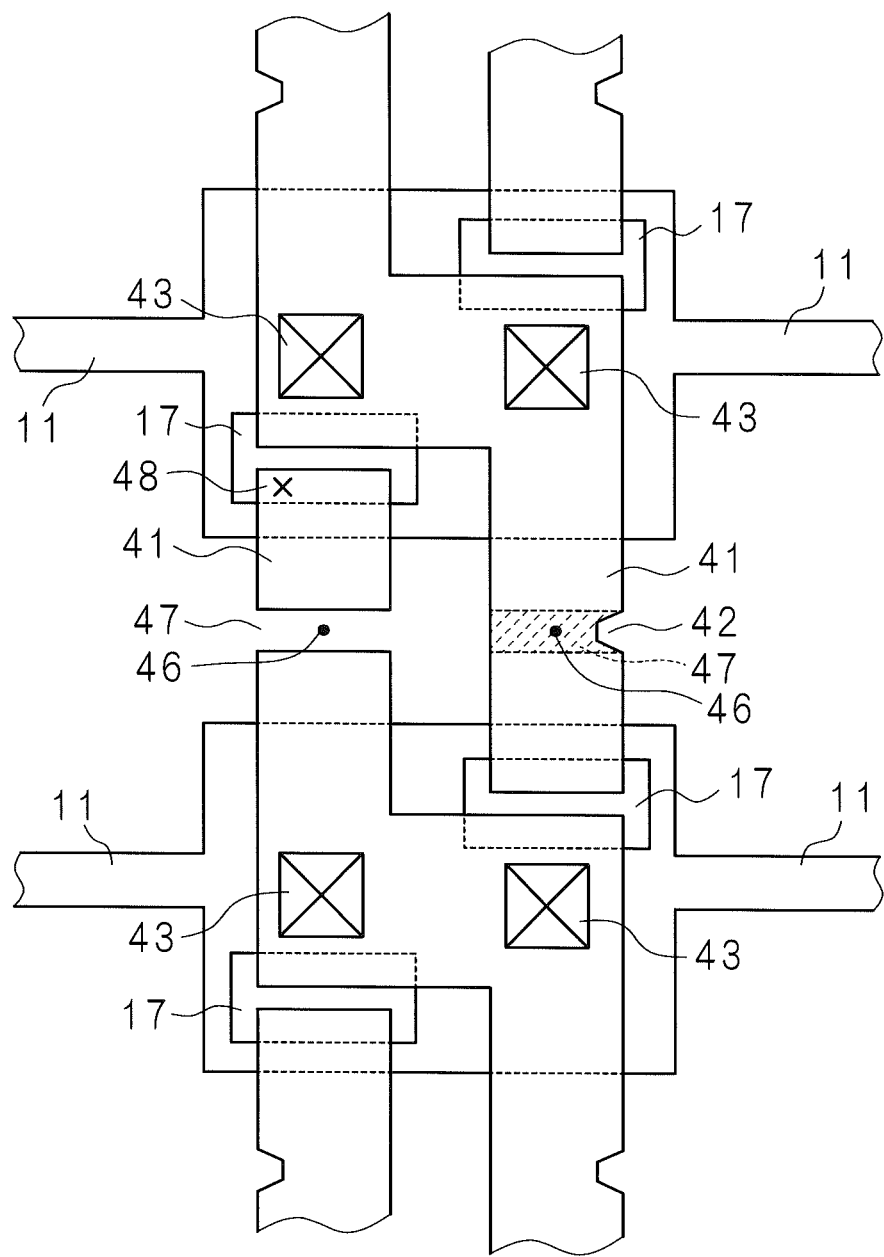
FIG. 6 is a schematic view showing a protection circuit obtained after cutting a connection wire.

In this Embodiment, a resistance between the gate wires 11 via the TFT 17 in the protection circuit 15 is measured at the time of manufacturing the active matrix circuit 1, and when a value of the measured resistance is not larger than a predetermined value, the laser cuts the connection wire 41 connected to the TFT 17 concerned with the decrease of the resistance at a position of the cutoff part 47. Actually, the laser cuts the cutoff part 47 representing the mark 42 on the connection wire 41. FIG. 6 is a schematic view showing the protection circuit 15 obtained after cutting the connection wire 41. In FIG. 6, a defective portion is represented by a reference numeral 48. The connection wire 41 connected to the TFT 17 including the defective portion 48 is cut at the cutoff part 47. The middle point 46 with respect to two contact holes 43 which are closest to the connection wire 41 is included in a range of the width of the cutoff part 47 which has been cut.

The protection circuit 16 has a configuration similar to the protection circuit 15. That is, the data wire 12 is connected to the TFT 17 via the connection wire 41, and the connection wire 41 includes the cutoff part 47. The middle point 46 which is equally distant on the connection wire 41 from two contact holes 43 closest to the connection wire 41 is included in a range of the width of the cutoff part 47. The mark 42 representing the cutoff part 47 is located. In this Embodiment, a resistance between the data wires 12 via the TFT 17 in the protection circuit 16 is measured at the time of manufacturing the active matrix circuit 1, and when a value of the measured resistance is not larger than a predetermined value, the cutoff part 47 represented by the mark 42 is cut on the connection wire 41 connected to the TFT 17 concerned with the decrease of the resistance.

As described above in detail, in this Embodiment, the TFT 17 is connected via the connection wire 41 between the gate wires 11 or between the data wires 12 in the protection circuits 15 and 16 in the active matrix circuit 1. The connection wire 41 includes the cutoff part 47, and the middle point 46 which is equally distant on the connection wire 41 from two contact holes 43 closest to the connection wire 41 is included in a range of the cutoff part 47. The mark 42 representing the cutoff part 47 is located. In a case where a defect of the decrease of a resistance between the gate wires 11 or between the data wires 12 via the TFT 17 occurs at the time of manufacturing the active matrix circuit 1, the cutoff part 47 represented by the mark 42 is cut on the connection wire 41 connected to the TFT 17 concerned with the occurring defect. Since the middle point 46 with respect to two contact holes 43 which are closest to the connection wire 41 is included in the range of the cutoff part 47, a position of the cutoff part 47 is a position apart from the contact hole 43 to a maximum extent. This can prevent a metal piece which disperses due to the cutting from adhering to the contact hole 43 to a maximum extent, thereby preventing from occurring other defect that a short circuit may arise via the metal piece between the contact hole 43 and the electrode layer 24. Thus, in the method of manufacturing the active matrix circuit 1 according to this Embodiment, the protection circuits 15 and 16 where a defect occurred can be modified while preventing from occurring other defect that a short circuit may arise between the contact hole 43 and the electrode layer 24 to a maximum extent.

In this Embodiment, the mark 42 is a narrowed part located only on one side of the connection wire 41. In a case where narrowed parts are located on both sides of the connection wire 41, the connection wire 41 may be extremely narrow at portions of the marks 42 to make the formation of a pattern of the connection wire 41 difficult. Also, in a case where the connection wire 41 is extremely narrow, there is a possibility that the connection wire 41 may be burned out at the time that an overcurrent flows through the connection wire 41, and the protection circuits 15 and 16 are susceptible to an overcurrent. It is possible to minimize the narrowness of the connection wire 41 and to maintain the resistance of the protection circuits 15 and 16 to an overcurrent due to the fact that the mark 42 is a narrowed part located only on one side of the connection wire 41. Note that the mark 42 may be located in the connection wire 41 on a side opposite to the example shown in FIG. 4.

Embodiment 2

Figure 8:
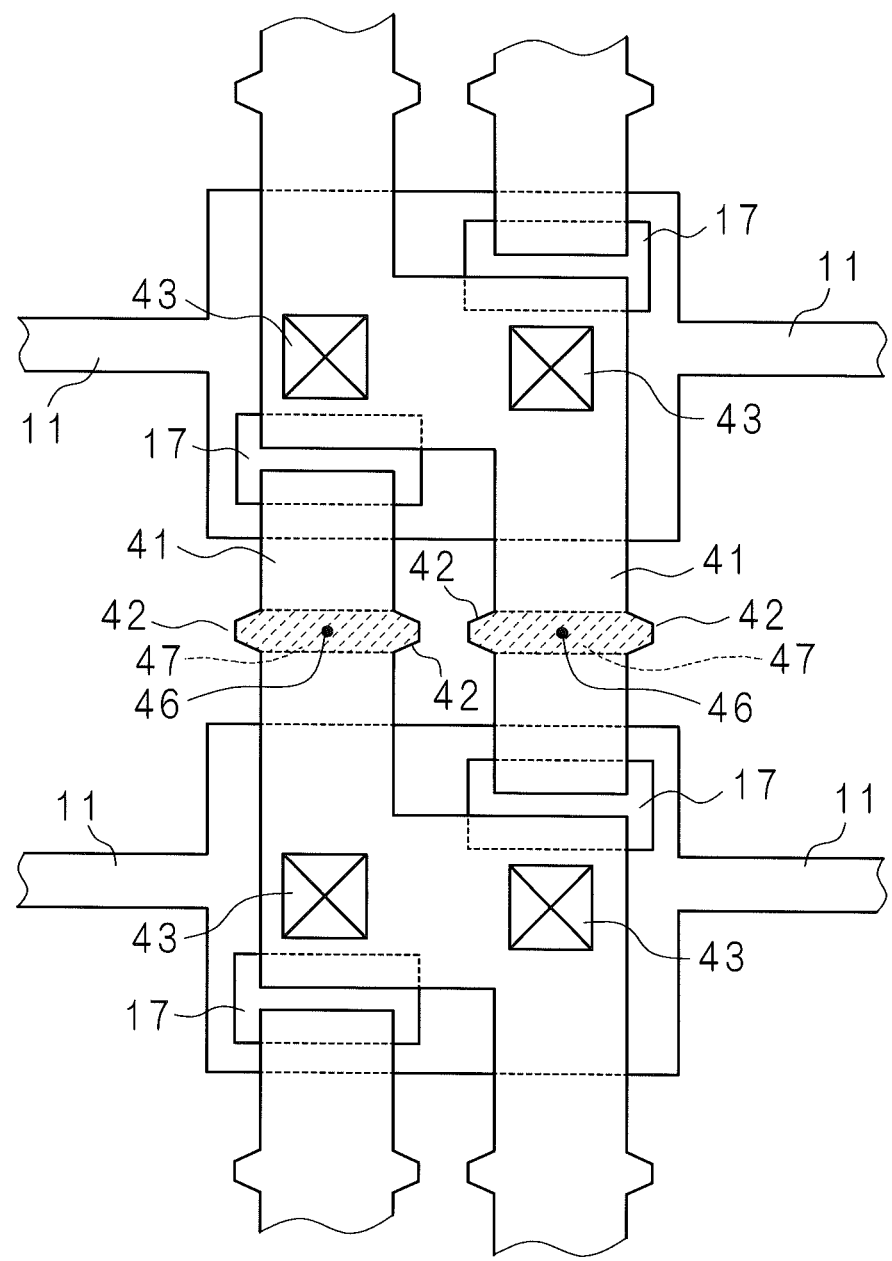
FIG. 8 is a schematic view expanding a connection portion where the gate wires in the protection circuit are connected to the TFTs according to Embodiment 2.
Figure 9:
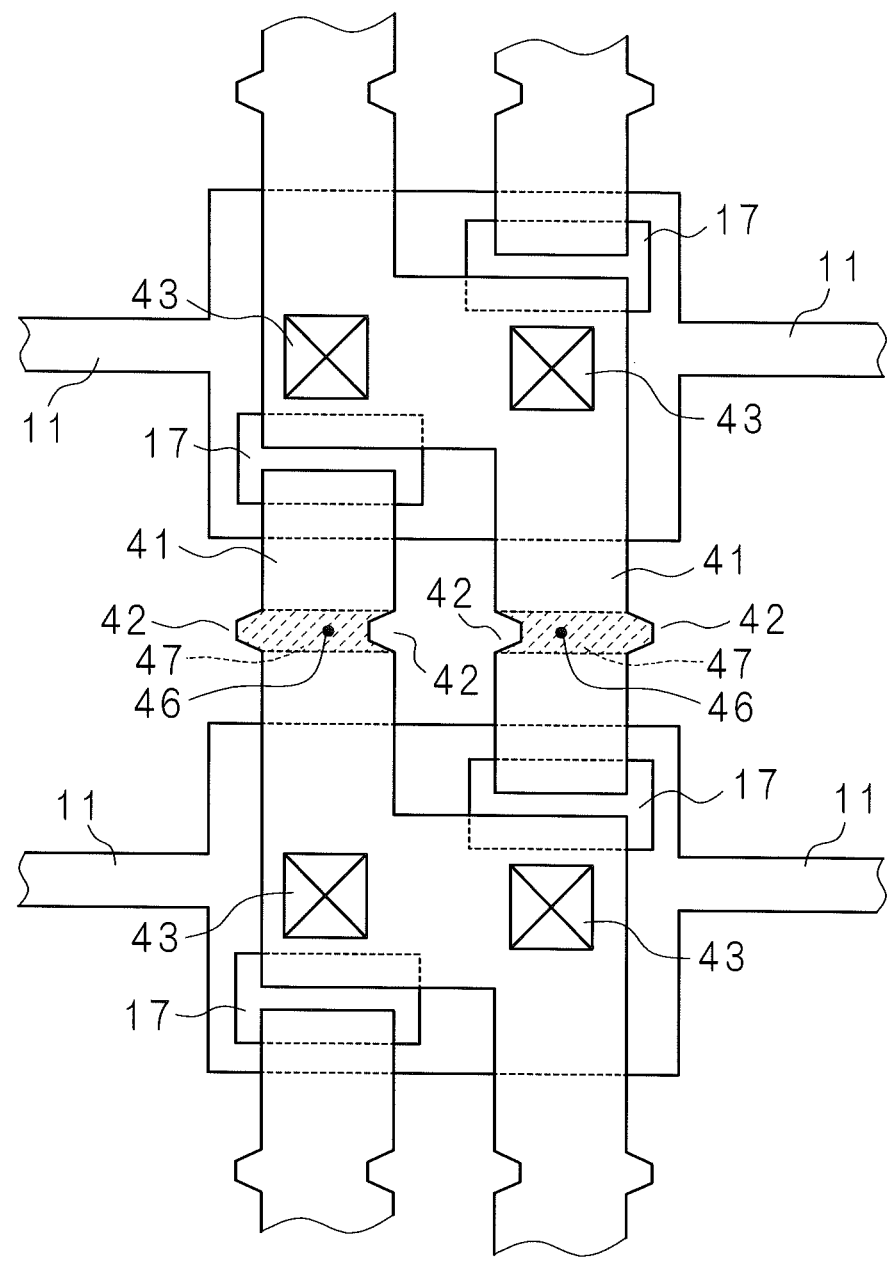
FIG. 9 is a schematic view expanding a connection portion where the gate wires in the protection circuit are connected to the TFTs according to Embodiment 2.

A configuration of an image display apparatus and a configuration of an active matrix circuit 1 in Embodiment 2 are the same as those in Embodiment 1. FIGS. 7 to 9 are schematic views expanding a connection portion where the gate wires 11 in the protection circuit 15 are connected to the TFTs 17 according to Embodiment 2. As shown in FIG. 7, a mark 42 in Embodiment 2 is a projecting part where a part of the connection wire 41 projects in a direction which crosses the connection wire 41. A position of a cutoff part 47 represented by the mark 42 is the same as that of Embodiment 1. That is, the middle point 46 which is equally distant on the connection wire 41 from two contact holes 43 closest to the connection wire 41 is included in a range of the cutoff part 47. FIG. 7 shows an example in which the mark 42 is located only on one side of the connection wire 41. Note that the mark 42 may have a shape of projecting from an opposite side of the connection wire 41 to a lateral side thereof. The mark 42 is formed of the projecting part, thereby preventing the connection wire 41 from being narrowed. FIG. 8 shows an example in which the mark 42 is located on both sides of the connection wire 41. Since the mark 42 is formed of projecting parts projecting from both sides of the connection wire 41, a position represented by the mark 42 is more recognizable. FIG. 9 shows an example in which the mark 42 is formed of a projecting part projecting from one side of the connection wire 41 and a narrowed part located on an opposite side of the connection wire 41. Positions of the projecting part and the narrowed part may be a side opposite to the example shown in FIG. 9. It is desirable that the insulating layer 45 is not laminated on at least a portion of the connection wire 41 where the mark 42 is formed and said at least portion of the connection wire 41 is exposed. Also in this Embodiment, the protection circuit 16 has a configuration similar to the protection circuit 15.

Also in this Embodiment, the cutoff part 47 to be cut of the connection wire 41 in a case where a defect occurs in the protection circuit 15 or 16 is represented by the mark 42. In a case where a defect of the decrease of a resistance between the gate wires 11 or between the data wires 12 via the TFT 17 occurs at the time of manufacturing the active matrix circuit 1, the cutoff part 47 represented by the mark 42 is cut on the connection wire 41 connected to the TFT 17 concerned with the occurring defect. The protection circuits 15 and 16 where a defect occurred can be modified while preventing from occurring other defect that a short circuit may arise between the contact hole 43 and the electrode layer 24 to a maximum extent.

Embodiment 3

Figure 10:
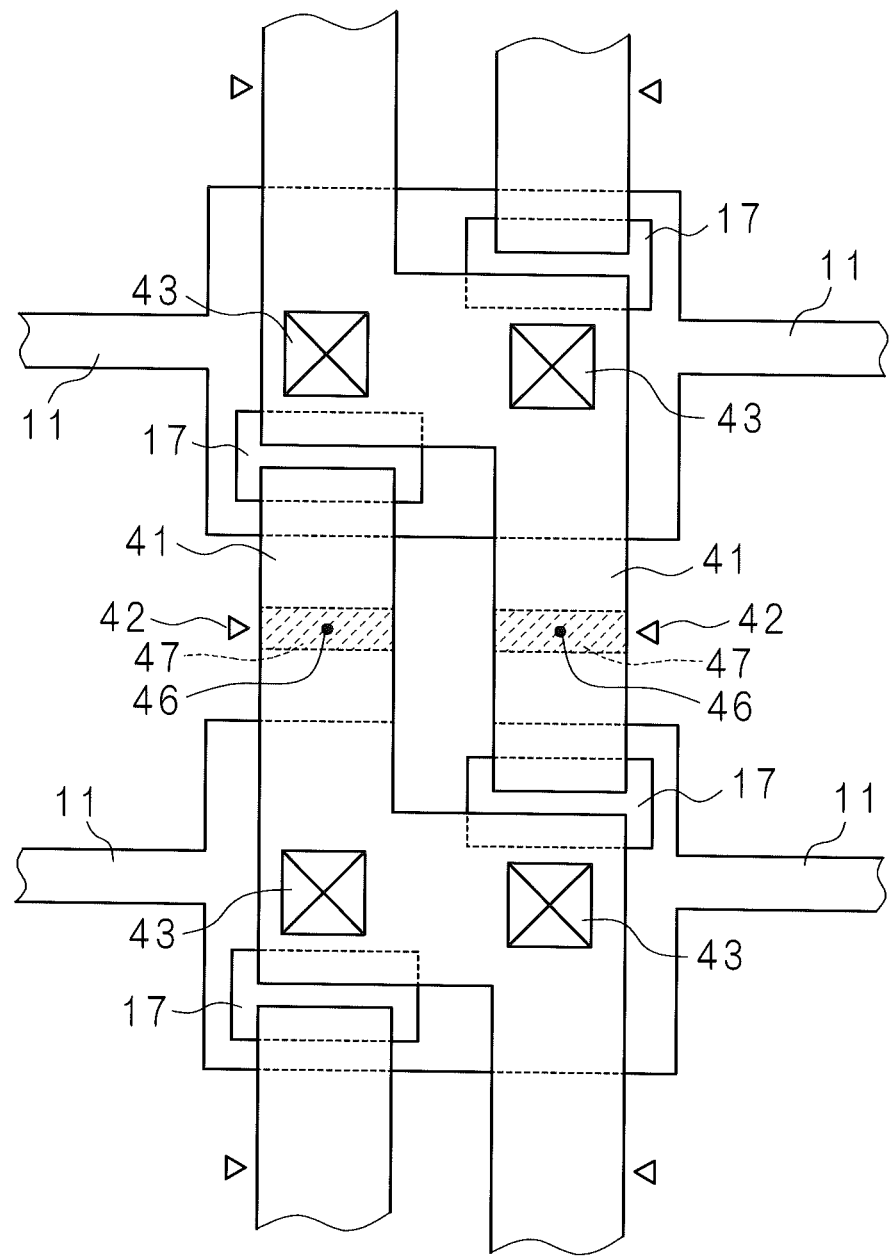
FIG. 10 is a schematic view expanding a connection portion where gate wires in a protection circuit are connected to TFTs according to Embodiment 3.

A configuration of an image display apparatus and a configuration of an active matrix circuit 1 in Embodiment 3 are the same as those in Embodiment 1. FIG. 10 is a schematic view expanding a connection portion where the gate wires 11 in the protection circuit 15 are connected to the TFTs 17 according to Embodiment 3. As shown in FIG. 10, the mark 42 in Embodiment 3 is a pattern which points the cutoff part 47 from outside of the connection wire 41. The middle point 46 which is equally distant on the connection wire 41 from two contact holes 43 closest to the connection wire 41 is included in a range of the cutoff part 47. The mark 42 is located apart from the connection wire 41, and is a metallic pattern formed on the insulating layer 44, for example. In order to confirm a portion of the connection wire 41 pointed by the mark 42, it is desirable that the insulating layer 45 is not laminated on at least the portion of the connection wire 41 pointed by the mark 42 and said at least portion of the connection wire 41 is exposed. Although FIG. 10 shows a form where the mark 42 is a triangular pattern, the mark 42 may be other pattern, such as an arrow. Also in this Embodiment, the protection circuit 16 has a configuration similar to the protection circuit 15.

Also in this Embodiment, the cutoff part 47 to be cut of the connection wire 41 in a case where a defect occurs in the protection circuit 15 or 16 is represented by the mark 42. In a case where a defect of the decrease of a resistance between the gate wires 11 or between the data wires 12 via the TFT 17 occurs at the time of manufacturing the active matrix circuit 1, the cutoff part 47 represented by the mark 42 is cut on the connection wire 41 connected to the TFT 17 concerned with the occurring defect. The protection circuits 15 and 16 where a defect occurred can be modified while preventing from occurring other defect that a short circuit may arise between the contact hole 43 and the electrode layer 24 to a maximum extent.

Embodiment 4

Figure 11:
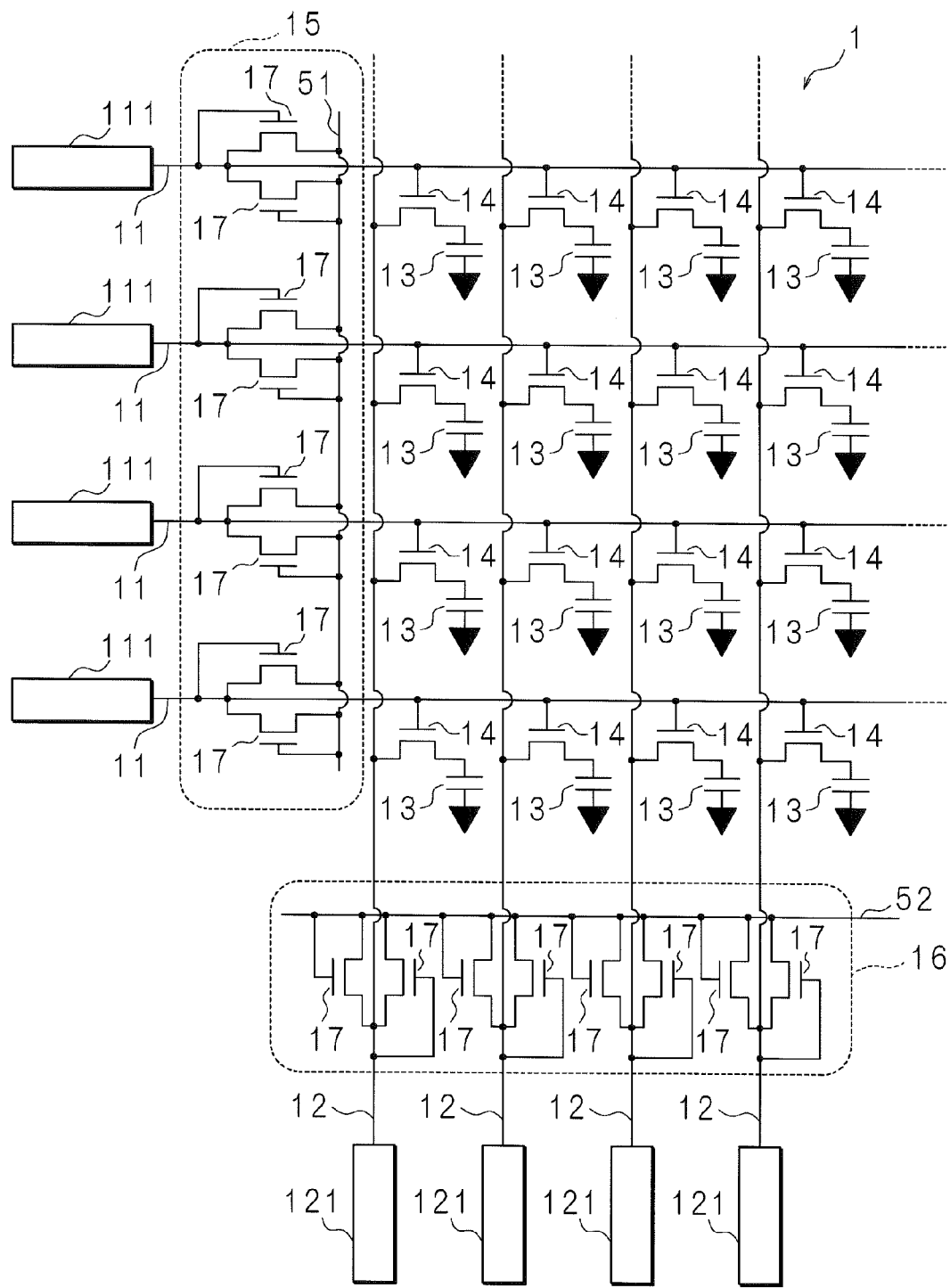
FIG. 11 is an equivalent circuit view of an active matrix circuit according to Embodiment 4.

A configuration of an image display apparatus in Embodiment 4 is the same as that in Embodiment 1. FIG. 11 is an equivalent circuit view of an active matrix circuit 1 according to Embodiment 4. The protection circuit 15 which protects the TFTs 14 connected to the gate wires 11 from static electricity is provided with one electrically conductive wire 51 in addition to the plurality of gate wires 11. In the protection circuit 15, two TFTs 17 are connected in anti-parallel between each gate wire 11 and the electrically conductive wire 51. Two terminals containing a gate of one TFT 17 are connected to the gate wire 11, the other one terminal is connected to the electrically conductive wire 51, two terminals containing a gate of the other TFT 17 are connected to the electrically conductive wire 51, and the other one terminal is connected to the gate wire 11. In a case where static electricity occurs in the active matrix circuit 1 and deviation of charges arises between the gate wire 11 and the electrically conductive wire 51, the TFTs 17 in the protection circuit 15 is turned on, and the charges are distributed to the plurality of gate wires 11 in sequence via the common electrically conductive wire 51 to protect the TFTs 14 in the active matrix circuit 1 from static electricity. In a case where deviation of charges does not arise, the TFTs 17 are in an off-state, a resistance is high, and no effect is exercised on a signal traveling through the gate wires 11.

The protection circuit 16 which protects the TFTs 14 connected to the data wires 12 from static electricity also is provided with one electrically conductive wire 52 in addition to the plurality of data wires 12. In the protection circuit 16, two TFTs 17 are connected in anti-parallel between each data wire 12 and the electrically conductive wire 52. In the same manner as the protection circuit 15, in a case where deviation of charges arises between the data wires 12 due to static electricity, the TFTs 17 in the protection circuit 16 is turned on, the charges are distributed to the plurality of data wires 12 in sequence via the common electrically conductive wire 52 to protect the TFTs 14 in the active matrix circuit 1 from static electricity.

A connection portion where the TFT 17 in the protection circuit 15 is connected to the gate wire 11 or the electrically conductive wire 51 according to this Embodiment has a configuration similar to those of Embodiments 1-3. That is, the TFT 17 is connected to the gate wire 11 or the electrically conductive wire 51 via the connection wire 41, and in the protection circuit 15, the contact hole 43 connects the gate wire 11 or the electrically conductive wire 51 to the connection wire 41. The connection wire 41 includes the cutoff part 47, and the middle point 46 which is equally distant on the connection wire 41 from two contact holes 43 closest to the connection wire 41 is included in a range of the cutoff part 47. The mark 42 representing the cutoff part 47 is located. Also in the protection circuit 16, the TFT 17 is connected to the data wire 12 or the electrically conductive wire 52 via the connection wire 41, the connection wire 41 includes the cutoff part 47, and the middle point 46 which is equally distant from two contact holes 43 closest to the connection wire 41 is included in a range of the cutoff part 47. The mark 42 representing the cutoff part 47 is located.

Also in this Embodiment, the cutoff part 47 to be cut of the connection wire 41 in a case where a defect occurs in the protection circuit 15 or 16 is represented by the mark 42. In a case where a defect of the decrease of a resistance between the gate wire 11 and the electrically conductive wire 51 via the TFT 17 or a resistance between the data wire 12 and the electrically conductive wire 52 via the TFT 17 occurs at the time of manufacturing the active matrix circuit 1, the cutoff part 47 represented by the mark 42 is cut on the connection wire 41 connected to the TFT 17 concerned with the occurring defect. The protection circuits 15 and 16 where a defect occurred can be modified while preventing from occurring other defect that a short circuit may arise between the contact hole 43 and the electrode layer 24 to a maximum extent.

Note that although the above Embodiments 1-4 exemplifies a form where two TFTs 17 connected in anti-parallel is employed as the switching element which protects the active matrix circuit 1, the present invention may be a form where other switching element is employed. Moreover, although the above Embodiments 1-4 exemplifies a form where one TFT 14 is employed as the active element which drives the pixel electrode 13, the present invention may be a form where other active element, such as an active element provided with a plurality of combined elements is employed. Furthermore, although the above Embodiments 1-4 exemplifies a form where the liquid crystal panel 2 comprises the active matrix circuit 1, other image display panel such as an EL (electro-luminescence) panel may comprise the active matrix circuit 1. The image display apparatus may be a form where an image is displayed using an image display panel other than the liquid crystal panel 2, such as an EL panel.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. An active matrix circuit comprising:
a plurality of signal wires arranged in a lattice shape;
a plurality of electrodes and a plurality of active elements which are arranged corresponding to intersections of the plurality of signal wires; and
a protection circuit which protects the active elements from static electricity,
wherein the protection circuit includes:
a switching element connected between a first signal wire and a second signal wire;
a first connection wire which connects the switching element to the first signal wire;
a second connection wire which connects the switching element to the second signal wire;
a first connection point where the first connection wire is connected to the first signal wire; and
a second connection point where the second connection wire is connected to the second signal wire, and
the first connection wire includes a cutoff part to be cut, and
the cutoff part is provided at a position which is equally distant on the first connection wire from the first connection point and the second connection point.

2. The active matrix circuit according to claim 1, wherein the protection circuit further includes a mark representing the cutoff part.

3. The active matrix circuit according to claim 2, wherein the mark is a part of the first connection wire projecting in a direction which crosses the first connection wire.

4. The active matrix circuit according to claim 2, wherein the mark is a narrowed part provided in a middle of the first connection wire.

5. The active matrix circuit according to claim 2, wherein the mark is located apart from the first connection wire, and is a pattern which points the cutoff part.

6. An image display apparatus, comprising an active matrix circuit according to claim 1.

7. The active matrix circuit according to claim 1, further comprising an insulating layer laminated on the first connection wire.

8. The active matrix circuit according to claim 7, wherein the insulating layer is not laminated on at least a portion of the first connection wire where the cutoff part is formed.

9. An active matrix circuit comprising:
a plurality of signal wires arranged in a lattice shape;
a plurality of electrodes and a plurality of active elements which are arranged corresponding to intersections of the plurality of signal wires; and
a protection circuit which protects the active elements from static electricity,
wherein the protection circuit includes:
an electrically conductive wire which is not connected to the signal wires;
a switching element connected to the electrically conductive wire and the signal wire;
a first connection wire which connects the switching element to the signal wire;
a second connection wire which connects the switching element to the electrically conductive wire;
a first connection point where the first connection wire is connected to the signal wire; and
a second connection point where the second connection wire is connected to the electrically conductive wire, and
the first or second connection wire includes a cutoff part to be cut, and
the cutoff part is provided at a position which is equally distant on the first or second connection wire from the first connection point and the second connection point.

10. The active matrix circuit according to claim 9, wherein
the protection circuit further includes a mark representing the cutoff part.

11. The active matrix circuit according to claim 10, wherein
the mark is a part of the first or second connection wire projecting in a direction which crosses the first or second connection wire.

12. The active matrix circuit according to claim 10, wherein
the mark is a narrowed part provided in a middle of the first or second connection wire.

13. The active matrix circuit according to claim 10, wherein
the mark is located apart from the first or second connection wire, and is a pattern which points the cutoff part.

14. A method of manufacturing an active matrix circuit according to claim 1, comprising
cutting a cutoff part of a first connection wire connected to a switching element whose resistance value in an off-state is not larger than a predetermined value.

15. A method of manufacturing an active matrix circuit according to claim 9, comprising
cutting a cutoff part of a first or second connection wire connected to a switching element whose resistance value in an off-state is not larger than a predetermined value.

16. An image display apparatus, comprising
an active matrix circuit according to claim 9.

17. An active matrix circuit comprising:
a plurality of signal wires arranged in a lattice shape;
a plurality of electrodes and a plurality of active elements which are arranged corresponding to intersections of the plurality of signal wires; and
a protection circuit which protects the active elements from static electricity,
wherein the protection circuit includes:
a switching element connected between first signal wire and second signal wire;
a first connection wire which connects the switching element to the first signal wire;
a second connection wire which connects the switching element to the second signal wire;
a first connection joint where first connection wire is connected to the first signal wire;
a second connection point where the second connection wire is connected to the second signal wire; and
a mark representing a position which is equally distant on the first connection wire from the first connection point and the second connection point.

18. An active matrix circuit comprising:
a plurality of signal wires arranged in a lattice shape;

a plurality of electrodes and a plurality of active elements which are arranged corresponding to intersections of the plurality of signal wires; and a protection circuit which protects the active elements from static electricity, wherein the protection circuit includes:

an electrically conductive wire which is not connected to the signal wires;

a switching element connected to the electrically conductive wire and the signal wire;

a first connection wire which connects the switching element to the signal wire;

a second connection wire which connects the switching element to the electrically conductive wire;

a first connection point where the first connection wire is connected to the signal wire;

a second connection point where the second connection wire is connected to the electrically conductive wire; and a mark representing a position which is equally distant on the first and second connection wire from the first connection point and the second connection point.

* * * * *